US012727392B2

(12) United States Patent
Khandan et al.

(10) Patent No.: US 12,727,392 B2
(45) Date of Patent: Sep. 1, 2026

(54) MULTI-STACK SUSCEPTOR REACTOR FOR HIGH-THROUGHPUT SUPERCONDUCTOR MANUFACTURING

(71) Applicant: MetOx International, Inc., Houston, TX (US)

(72) Inventors: Shahab Khandan, Houston, TX (US); Nagaraja Shashidhar, Houston, TX (US); Mikhail Novozhilov, Houston, TX (US)

(73) Assignee: MetOx International, Inc., Houston, TX (US)

( * ) Notice: Subject to any disclaimer, the term of this patent is extended or adjusted under 35 U.S.C. 154(b) by 410 days.

(21) Appl. No.: 18/407,993

(22) Filed: Jan. 9, 2024

(65) Prior Publication Data

US 2024/0188450 A1 Jun. 6, 2024

Related U.S. Application Data

(63) Continuation of application No. 18/016,338, filed as application No. PCT/US2022/017868 on Feb. 25, 2022, now Pat. No. 11,910,726.

(60) Provisional application No. 63/154,119, filed on Feb. 26, 2021.

(51) Int. Cl.

| | |
|---|---|
| ***C23C 16/455*** | (2006.01) |
| ***C23C 16/458*** | (2006.01) |
| ***C23C 16/46*** | (2006.01) |
| ***C23C 16/52*** | (2006.01) |
| ***C23C 16/54*** | (2006.01) |
| ***H10N 60/01*** | (2023.01) |

(52) U.S. Cl.
CPC ... *H10N 60/0464* (2023.02); *C23C 16/45565* (2013.01); *C23C 16/458* (2013.01); *C23C 16/4586* (2013.01); *C23C 16/46* (2013.01); *C23C 16/52* (2013.01); *C23C 16/545* (2013.01)

(58) Field of Classification Search
None
See application file for complete search history.

(56) References Cited

U.S. PATENT DOCUMENTS 3,190,262 A * 6/1965 Bakish .................. C23C 16/545 118/724
5,364,481 A * 11/1994 Sasaki .................. C23C 16/545 136/258
6,827,787 B2 * 12/2004 Yonezawa ............ C23C 16/545 156/345.43
7,247,340 B2 * 7/2007 Salagaj ................ C23C 16/545 505/740
8,268,386 B2 * 9/2012 Selvamanickam .......................... C23C 16/45517 505/740
8,728,575 B2 * 5/2014 Li ........................ C23C 16/545 427/249.1
9,255,330 B2 * 2/2016 Vangeneugden ..... C23C 16/545
9,567,671 B2 * 2/2017 Knaapen .............. C23C 16/545
9,892,827 B2 * 2/2018 Majkic .................. C23C 16/448
10,934,624 B2 * 3/2021 Suzuki .................... C23C 16/50

(Continued)

*Primary Examiner* — Binu Thomas

(57) ABSTRACT

A vapor deposition reactor apparatus, systems and methods for deposition of thin films, particularly high-temperature superconducting (HTS) coated conductors, utilize multi-sided susceptors and susceptor pairs for increased production throughput. The reactors may also be configured in multi-stack arrangements of the susceptors within a single reactor chamber for additional throughput gains.

14 Claims, 18 Drawing Sheets

(56) References Cited

U.S. PATENT DOCUMENTS 11,214,872 B2 * 1/2022 Hsieh .................... C23C 16/545
2005/0223984 A1 * 10/2005 Lee ..................... C23C 16/4557 118/715
2012/0329658 A1 * 12/2012 Moon .................. C23C 14/562 117/54

* cited by examiner 230
230
230
230
410
410
610
610
420
270
262
d
510
520
264

Figure 13:
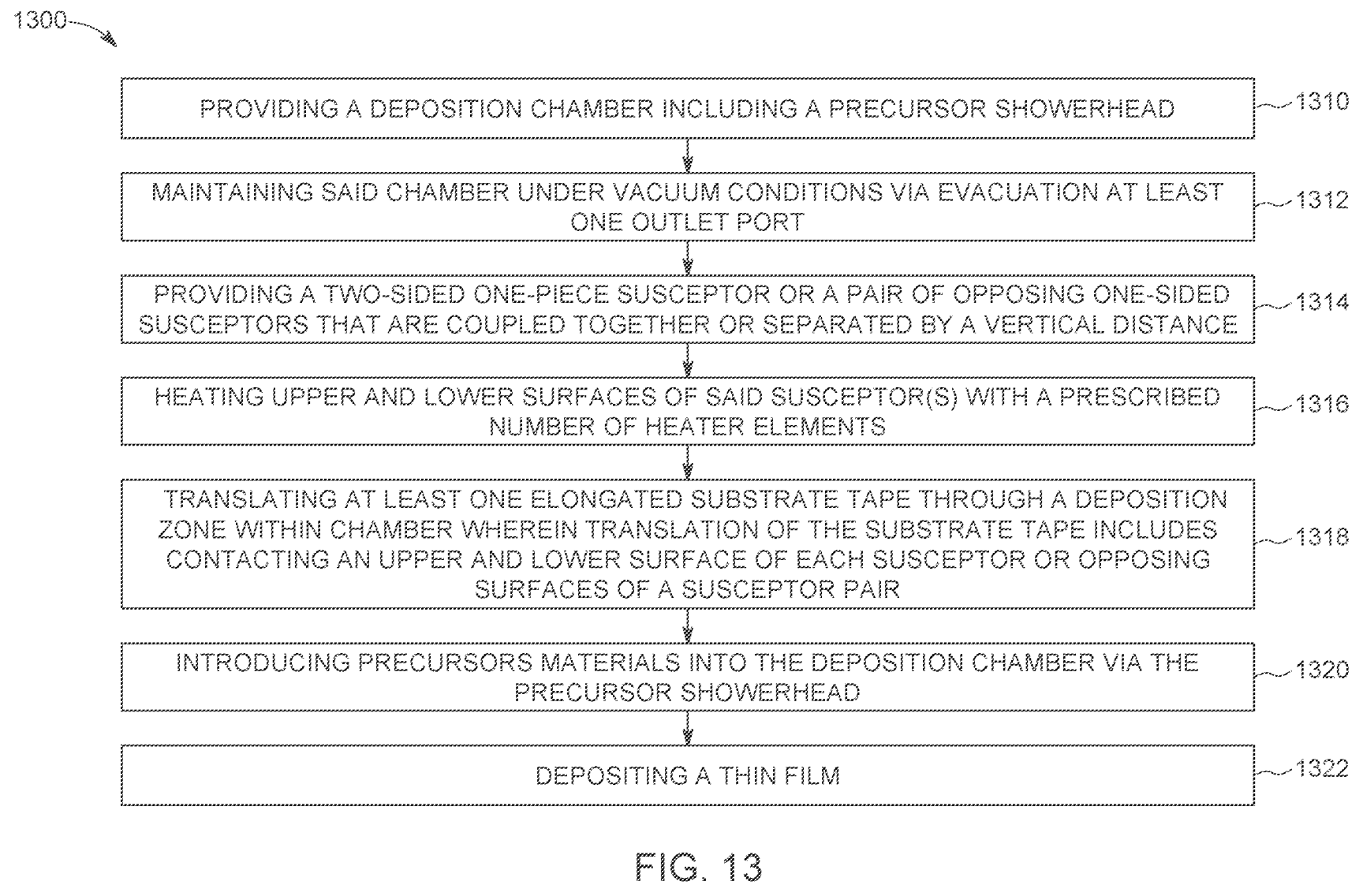

1300

1310 PROVIDING A DEPOSITION CHAMBER INCLUDING A PRECURSOR SHOWERHEAD

1312 MAINTAINING SAID CHAMBER UNDER VACUUM CONDITIONS VIA EVACUATION AT LEAST ONE OUTLET PORT

1314 PROVIDING A TWO-SIDED ONE-PIECE SUSCEPTOR OR A PAIR OF OPPOSING ONE-SIDED SUSCEPTORS THAT ARE COUPLED TOGETHER OR SEPARATED BY A VERTICAL DISTANCE

1316 HEATING UPPER AND LOWER SURFACES OF SAID SUSCEPTOR(S) WITH A PRESCRIBED NUMBER OF HEATER ELEMENTS

1318 TRANSLATING AT LEAST ONE ELONGATED SUBSTRATE TAPE THROUGH A DEPOSITION ZONE WITHIN CHAMBER WHEREIN TRANSLATION OF THE SUBSTRATE TAPE INCLUDES CONTACTING AN UPPER AND LOWER SURFACE OF EACH SUSCEPTOR OR OPPOSING SURFACES OF A SUSCEPTOR PAIR

1320 INTRODUCING PRECURSORS MATERIALS INTO THE DEPOSITION CHAMBER VIA THE PRECURSOR SHOWERHEAD

1322 DEPOSITING A THIN FILM

MULTI-STACK SUSCEPTOR REACTOR FOR HIGH-THROUGHPUT SUPERCONDUCTOR MANUFACTURING

CROSS REFERENCE TO RELATED APPLICATIONS

This application is a continuation of U.S. patent application Ser. No. 18/016,338 filed Jan. 14, 2023, which is a national stage application from PCT Application PCT/US22/17868 filed Feb. 25, 2022, entitled "Multi-Stack Susceptor Reactor for High-Throughput Superconductor Manufacturing" which claims priority and benefit from U.S. Provisional Patent Application No. 63/154,119 filed on Feb. 26, 2021, entitled "Multi-Stack Susceptor CVD Reactor for High-Throughput HTS Tape Manufacturing", the contents of which are all incorporated in their entirety herein by reference.

BACKGROUND OF THE INVENTION

Technical Field

Embodiments of the subject matter disclosed herein generally relate to deposition reactors and more particularly to vapor deposition reactors for fabricating high-temperature superconductors on substrate tapes.

Discussion of the Background

High temperature superconductors (HTS) provide the potential for development of superconductor components at higher operating temperatures compared to traditional superconductors that operate at liquid helium temperature (4.2K). Superconductors operating at the higher temperatures thus provide the ability to develop superconducting components and products more economically. Thin film HTS material comprised of $YBa_2Cu_3O_{7-x}$ (YBCO), is one of a group of oxide-based superconductors. After the initial discovery of YBCO superconductors, other superconductors were discovered having a similar chemical composition but with Y replaced by other rare earth elements. This family of superconductors is often denoted as REBCO where RE may include Y, La, Nd, Sm, Eu, Gd, Tb, Dy, Ho, Er, Tm, Yb or Lu. This material formed the basis for second generation or "2G" HTS wire technology which provides a more cost-effective material for manufacturing HTS tapes and wires.

Such HTS films are typically deposited as textured REBCO thin films which may include one or more buffer layers onto an atomically textured metal substrate. In the case of MOCVD, an organic ligand may comprise a vapor phase precursor delivered to the substrate for deposition. In the manufacturing of High Temperature Superconductors (HTS) via chemical vapor deposition (CVD) or metal-organic chemical vapor deposition (MOCVD) processing, a metallic, e.g., a stainless steel or Hastelloy substrate tape is heated to high temperature, for example, 800° C. to 900° C. for the vapor phase precursor materials to deposit on the substrate tape and HTS film growth to occur.

MOCVD technology has been directly applied to YBCO film growth and has shown the capability for fabrication of high quality YBCO through modification of traditional semiconductor MOCVD for higher temperatures, oxidizing atmospheres and lower vapor pressure precursors (Zhang et. al.). The higher temperatures (more than 200K higher than that used for semiconductor III-V compound MOCVD) require improved reactor designs and improved heaters, and the lower vapor pressure precursors require enhanced attention to precursor vapor flow control and stability. The initial results were promising, and for YBCO films grown on single crystal oxide substrates Tc>90K and Jc>$10^6$ A/cm$^2$ were realized (Schulte et al.).

With the discovery of high temperature superconductor (HTS) materials; one of the foci was directed towards the development of HTS wire for high-power electrical applications. Such applications include, but are not limited to, transmission cables, distribution cables, electric motors, electric generators, electric magnets, fault current limiters, transformers, and energy storage. For the HTS wire to be a successful solution for these high-power electrical applications, it needs to meet the high-power electrical requirements of the different applications while being low enough in cost to meet the commercial requirements for these applications.

Typical MOCVD reactors for HTS production utilize a heated susceptor inside the reactor to grow YBCO film on a metallic, e.g., a Hastelloy or stainless steel tape that is heated by contact with a hot susceptor. A conventional CVD reactor 100 is shown in FIG. 1 and includes a reactor chamber 105 which is maintained at vacuum conditions via an outlet port 120 and houses such components as an inlet showerhead 110 for introduction of precursors. Such reactors utilize a hot block type susceptor 160 that supports and transfers heat from the upper surface of the susceptor to a substrate tape 130 which is continuously fed from a payout reel 140 and a take-up reel 150 and translates across the top of the susceptor 160.

The HTS tape manufacturing throughput is limited by several factors but primarily the reactor size and the susceptor size, particularly its length. There are challenges with simply increasing the susceptor length to increase the production throughput including precursor gas flow uniformity over the tape and maintaining a tight temperature uniformity on the tape as the susceptor length increases. Large reactors and long susceptors also have manufacturing challenges and require a larger manufacturing footprint and space. With the susceptor length limitation, the manufacturing throughput can increase simply by adding more reactors to increase the production capacity. However, adding additional reactor units to increase production requires duplicating expensive equipment and a larger manufacturing floor plan and space which adds substantial capital cost. Thus, it is of great value to develop a superconducting article production apparatus and process with high throughput capabilities to produce high performance HTS wire with commercially attractive economics.

SUMMARY OF EXAMPLE EMBODIMENTS

According to an embodiment, there is a vapor deposition apparatus for manufacturing a superconductor on an elongated substrate tape. The apparatus includes a deposition chamber maintained under vacuum and housing a precursor inlet showerhead, an outlet port, and a heated substrate susceptor having more than one tape contacting surface, an elongated substrate tape continuously spooled between a payout reel and a take-up reel. The elongated substrate tape slidably contacts more than one surface of the substrate susceptor.

According to another embodiment, there is a method for producing a superconductor on an elongated substrate tape. The method includes providing a deposition chamber housing a precursor inlet showerhead, an outlet port, and a heated substrate susceptor having more than one tape contacting surface. The deposition chamber is maintained under vacuum conditions via evacuation by the outlet port. Each tape contacting surface of said susceptor is heated with at least one heater element. At least one elongated substrate tape is translated through a deposition zone within the chamber and the substrate tape contacts each of the more than one tape contacting surfaces of susceptor. Precursor materials are introduced into the deposition chamber via the precursor showerhead and at least one layer of a thin film is deposited upon the elongated substrate tape.

According to yet another embodiment, there is a method for producing a superconductor on an elongated substrate tape. The method includes providing a deposition chamber housing a precursor inlet showerhead, an outlet port, and a pair of opposing one-sided susceptors. The deposition chamber is maintained under vacuum conditions via evacuation by the outlet port. The tape contacting surfaces of each susceptor is heated with a heater element. At least one elongated substrate tape is translated through a deposition zone within the chamber and the substrate tape contacts opposite surfaces of the susceptor pair. Precursor materials are introduced into the deposition chamber via the precursor showerhead and at least one layer of a thin film is deposited upon the elongated substrate tape.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 13 shows an exemplary method for producing thin film materials.

FIG. 15 shows yet another exemplary method producing thin film materials.

DETAILED DESCRIPTION OF EXAMPLES OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to vapor deposition reactors, systems and methods for deposition of thin films, particularly superconducting coated conductors formed from films deposited on substrate tapes in a CVD and more particularly in a metal-organic chemical vapor deposition (MOCVD) reactor. However, the embodiments discussed herein are not limited to such elements. For example, the reactor apparatus disclosed herein may have application to other reactor types that utilize a susceptor for heating a substrate of any type and where high throughput is desired, for example, Pulsed Laser Deposition (PLD) and other deposition processes and thin film depositions.

Reference throughout the specification to “one embodiment” or “an embodiment” means that a particular feature, structure, or characteristic described in connection with an embodiment is included in at least one embodiment of the subject matter disclosed. Thus, the appearance of the phrases “in one embodiment” or “in an embodiment” in various places throughout the specification is not necessarily referring to the same embodiment. Further, the described features, structures or characteristics may be combined in any suitable manner in one or more embodiments. Thus, the following description provides examples of the subject matter disclosed herein to enable those skilled in the art to practice the same, including making and using any apparatus, system and performing the methods described. The patentable scope of the subject matter is defined by the claims and may include other examples that fall within the scope of the claims that occur to those skilled in the art having the benefit of the present disclosure.

Figure 1:
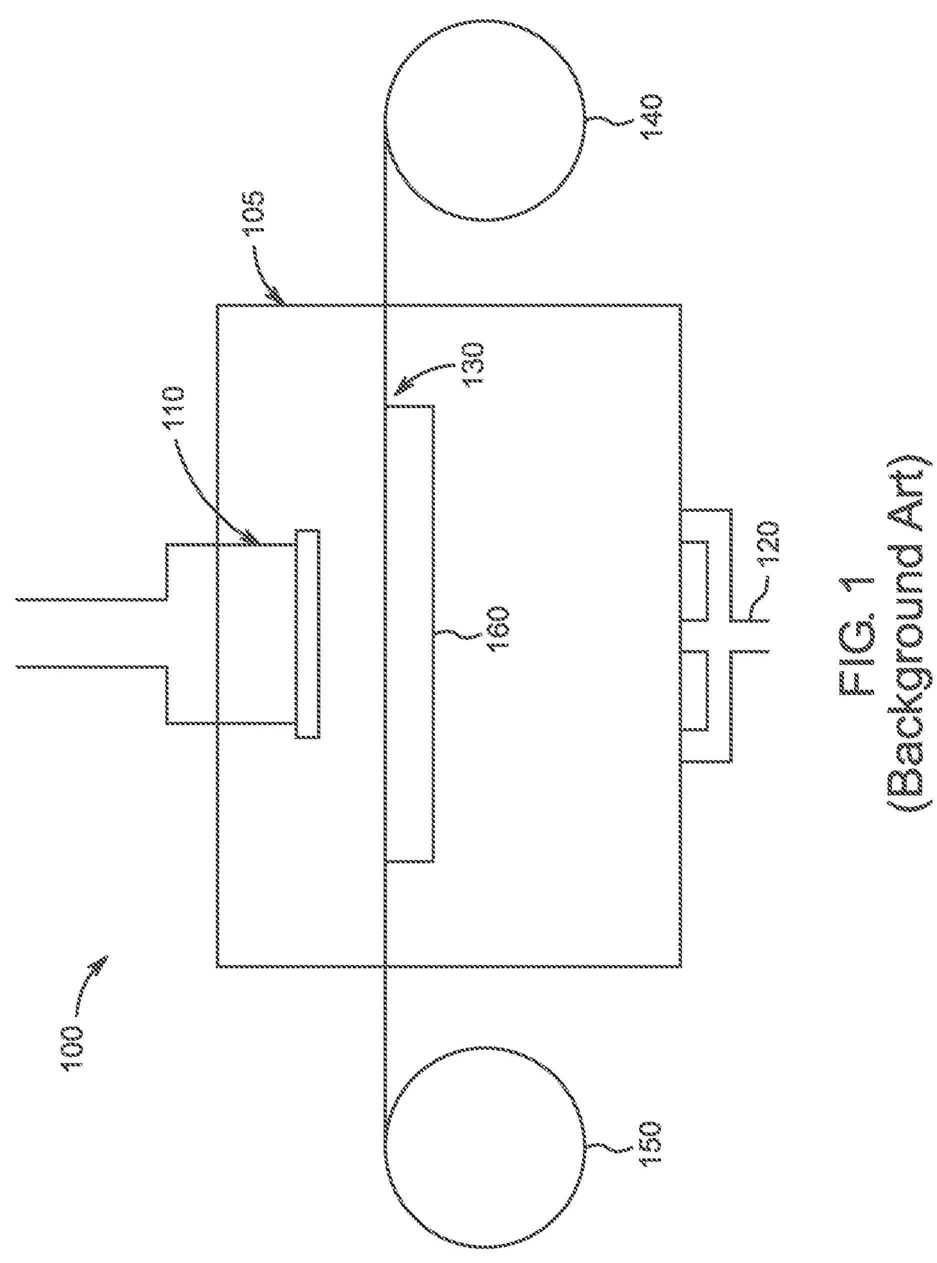
FIG. 1 shows a prior art CVD reactor with a susceptor and elongated substrate tape.
Figure 2:
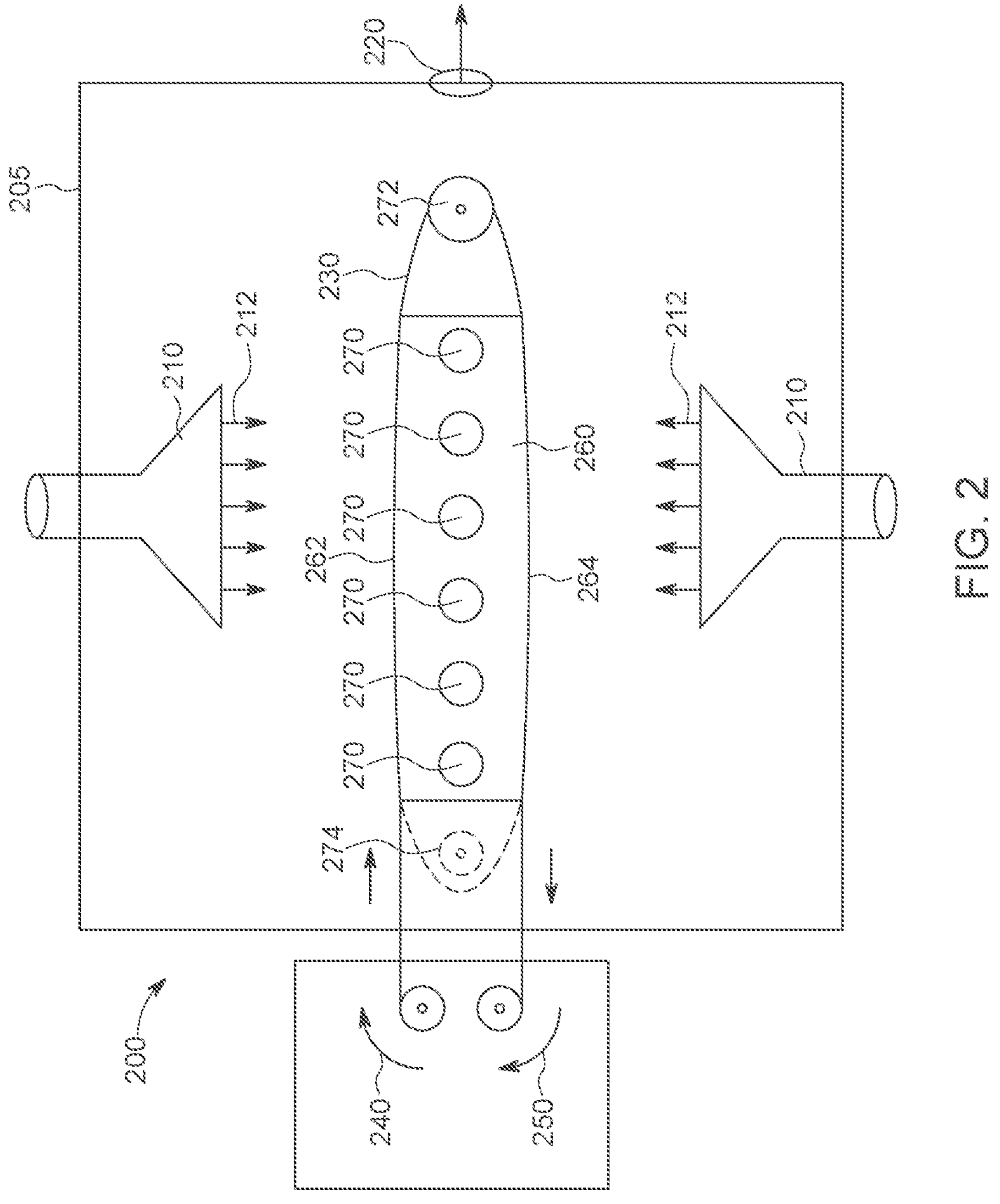
FIG. 2 shows an exemplary CVD reactor apparatus with a two-sided susceptor.

An exemplary reactor apparatus employing a two-sided, one-piece substrate susceptor is shown in side-view in FIG. 2. In the embodiment, reactor apparatus 200 includes deposition chamber 205 which is maintained in preferred embodiments under vacuum conditions by vacuum pump (not shown) evacuation at outlet port 220. Also housed in chamber 205 is a precursor inlet showerhead 210 for introduction of precursor materials 212. FIG. 2 illustrates a reactor chamber 205 with upper and lower showerheads 210 to aid in flow and deposition uniformity at the upper 262 and lower 264 surfaces of susceptor 260. Also note that in dual or multiple showerhead 210 configurations, and in order to maintain symmetry and flow uniformity, a single outlet 220 is shown in FIG. 2 as located at a sidewall of reactor 205. These depictions of showerhead and outlet number, positions and configurations are exemplary however and other arrangements are contemplated by the disclosure herein.

In the manufacturing of High Temperature Superconductors (HTS) via chemical vapor deposition (CVD) or metal-organic chemical vapor deposition (MOCVD) processing, precursors 212 flow towards a deposition zone defined generally as the area within a reactor 205 that is near the outlet of a showerhead 210 and along the elongated substrate tape 230 area that is supported and heated by substrate susceptor 260. A thin film, e.g., a buffer layer or YBCO, will deposit upon the exposed surface of the substrate tape 230 above the susceptor 260.

Precursors 212 may in certain embodiments of MOCVD produced HTS be comprised of vapor phase metal-organic ligands. Known systems for precursor 212 delivery include gas, liquid, solid, and slurry-based approaches. In preferred embodiments using MOCVD, and in particular photo-assisted metal-organic chemical vapor deposition (PAMOCVD) based depositions, the precursors may be delivered as metal-organic compounds either as flash evaporated solids or as solvated vapor phase molecules using tetrahydrofuran (THF) or other suitable organic solvent. For example, a solid feed precursor delivery apparatus with an evaporator as a system is disclosed in PCT Application PCT/US2019/68194 which is assigned to the present Applicant and is incorporated by reference herein for all purposes.

In preferred embodiments, substrate susceptor 260 may be manufactured from a metal alloy such as Inconel that is machinable and has a suitable thermal conductivity, or alternatively may be composed of Silicon Carbide (SiC) and typically includes one or more internal heater elements 270 arranged in one or more rows, or as a staggered array, groups, or other configurations. Heater elements 270 may be comprised of resistive type (electrical) heaters which as shown are incorporated into the body of susceptor 260 but may also be external but in direct contact with susceptor 260. In other embodiments, heater elements 270 also may be a non-contact type reliant upon radiative heat transfer, for example halogen or infra-red (IR) lamps, or silicon carbide (SiC) glow bars as examples. In HTS manufacturing, susceptor 260 heats substrate tape 230 to a high temperature, for example, 800° C. to 900° C. for the vapor phase precursor materials to deposit on the substrate tape and HTS film growth to occur.

HTS films are typically deposited as textured REBCO thin films which may include one or more buffer layers deposited and/or grown onto an atomically textured elongated metal substrate 230, for example, a thin metallic, e.g., a stainless steel or Hastelloy tape nominally 10-12 millimeters wide and of variable length, from a single meter to hundreds of meters or even kilometers in length. Returning to the embodiment depicted in FIG. 2, substrate tape 230 is continuously spooled from a payout reel 240 to a take-up reel 250 which are both located in this example external to deposition chamber 205. Reels 240 and 250 may, however, be located inside deposition chamber 205 thus as a fully enclosed system which has the benefits of reducing contamination and minimizing vibration of the tape 230 during translation. Reels 240 and 250 may also be housed external the reactor but within separate enclosures (see e.g., FIG. 10*a*) with or without conduits (not shown) between the reel enclosures and reactor chamber 205 (see also below discussion regarding FIG. 10*a*).

In FIG. 2, substrate tape 230 enters chamber 205 via a narrow slit in a chamber 205 wall, translates over an upper surface 262 of substrate susceptor 260, reverses direction around roller 272, contacts the lower surface 264 of susceptor 260, exits via another narrow slit in the wall of chamber 205 and is taken up by take-up reel 250. An increase in throughput for the same or nearly same reactor is thus achieved in this manner since substrate susceptor 260 has doubled the effective deposition zone length in this example without increasing the susceptor length or significantly increasing the size of the reactor chamber 205.

Figure 3:
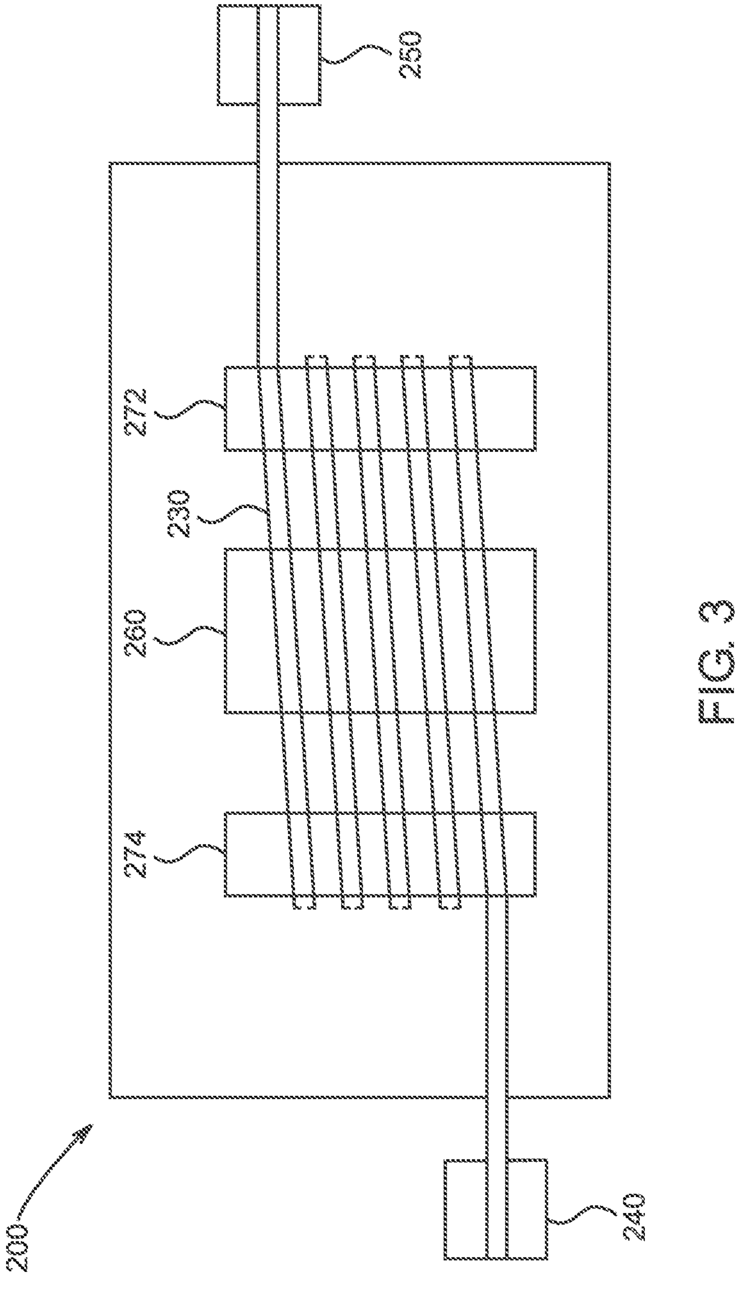
FIG. 3 show a single substrate tape winding over a susceptor in an exemplary multi-pass configuration.

Additional throughput gains can be realized with apparatus 200 if substrate tape 230 is configured in a multi-pass arrangement. In certain embodiments, a second roller shown in dotted line as 274 in sideview in FIG. 2 is added which allows for a helical wrapping of substrate tape 230 around rollers 272 and 274 as shown in top-down view in FIG. 3. In this embodiment, each pass of substrate tape 230 contacts both upper 262 and lower 264 surfaces of susceptor 260. Also, as shown in FIG. 2, upper 262 and lower 264 surfaces of susceptor 260 may be curved in the lengthwise axis to facilitate improved contact with substrate tape 230.

Figure 4:
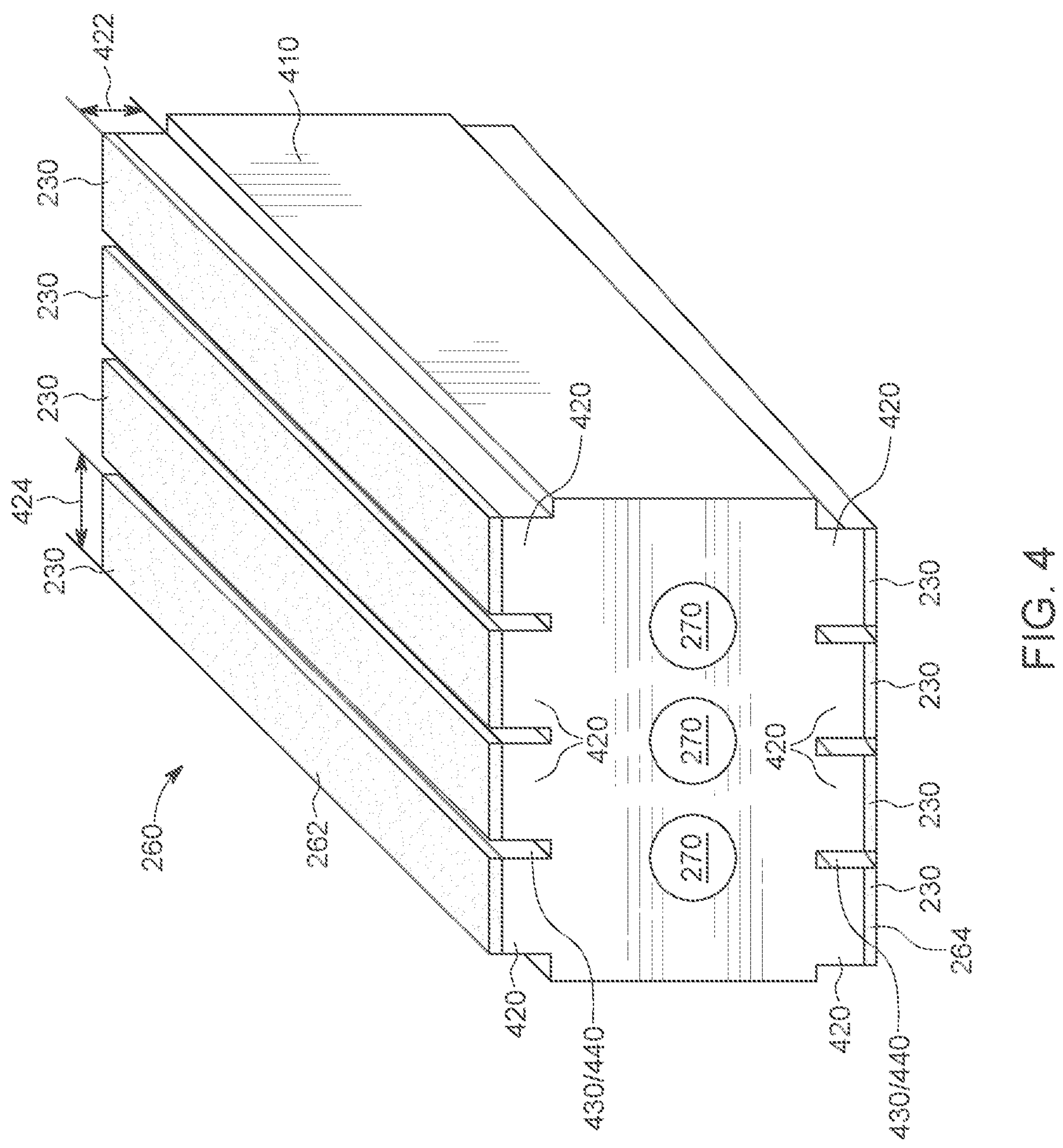
FIG. 4 shows an exemplary two-sided, one-piece susceptor with raised sections.

The two-sided single piece substrate susceptor 260 may also include structural aspects as disclosed in pending International Application No. PCT/US2021/17935 which is also assigned to the present Applicant and is incorporated by reference herein for all purposes. For example, in certain embodiments as shown in FIG. 4, substrate susceptor 260 is comprised of a main body 410 which forms the base of susceptor 260. In these embodiments, susceptor 260 may be configured to support more than one substrate tape 230 or multiple passes of the same substrate tape 230 that loops via rollers 272/274 (not shown) that cause tape 230 to reverse direction and to pass through the reactor deposition zone more than one time.

Returning to FIG. 4, two or more raised sections 420 extend vertically from main body 410 and extend lengthwise along the length of susceptor 260. Each raised section 420 is separated from an adjacent raised section 420 by a gap 430 that extends downward to a prescribed depth 422 and forms a channel 440. These channels serve as reservoirs for errant deposited material and aid in minimizing contamination of substrate tape 230. Raised sections 420 are preferably of the same composition as the main body 410 and may be machined, cast or milled from a single block of material. Other approaches may include laser etching or band saw cutting to produce gaps 430. In other embodiments, it is possible to have the raised sections 420 separate from but operably coupled to the main body 410. In this case, the raised sections 420 may be of the same material as main body 410 or it may be of a different material with different thermal conductivity. In this case, the raised sections 420 may be attached to the main body 410 using different methods; examples include screws or high temperature bonding compounds. In preferred embodiments, each raised section is shaped with vertical sides 422 thus each section is rectangular in cross section, however, in other embodiments raised sections 420 may be shaped differently, e.g., trapezoidal etc. as described in PCT/US2021/17935.

The width of the top surface 424 of raised section 420 is preferably the same or less than the width of a single substrate tape 230. For example, in certain embodiments, substrate tape 230 may be nominally 12 mm wide, and thus raised section 420 top surface 424 is 12 mm wide. In other embodiments, raised section 420 top surface may be slightly less in width, thus in this example, top surface 424 may be 10-11 mm wide. In this example, substantially the full width of substrate tape 230 leaves no portion of top surface 424 exposed and hence minimizes build-up of errant deposition on the susceptor 260 such that sides of the substrate tape 230 are contaminate free. Note that in this embodiment, both upper 262 and lower 264 surfaces of a two-sided hot block substrate susceptor 260 as shown are conductively heated via a shared set of heater elements 270. Also note that for simplicity upper 262 and lower 264 surfaces of susceptor 260 are shown as flat, but as discussed above, may be curved in the longitudinal axis to aid contact with substrate tape(s) 230.

Thus, tape handling configurations described herein may encompass a "single-pass" configuration whereby tape 230 passes above and below the susceptor, or a single-length tape 230 run in a "multi-pass" helically wound configuration (as shown for example in FIG. 3), or several separate tapes 230 running in parallel again above and below a susceptor. Regardless of the tape number or configuration, each tape or tapes 230, passes over both upper 262 and lower 264 surfaces of two-sided substrate susceptor 260 thus achieving greater throughput.

Figure 5:
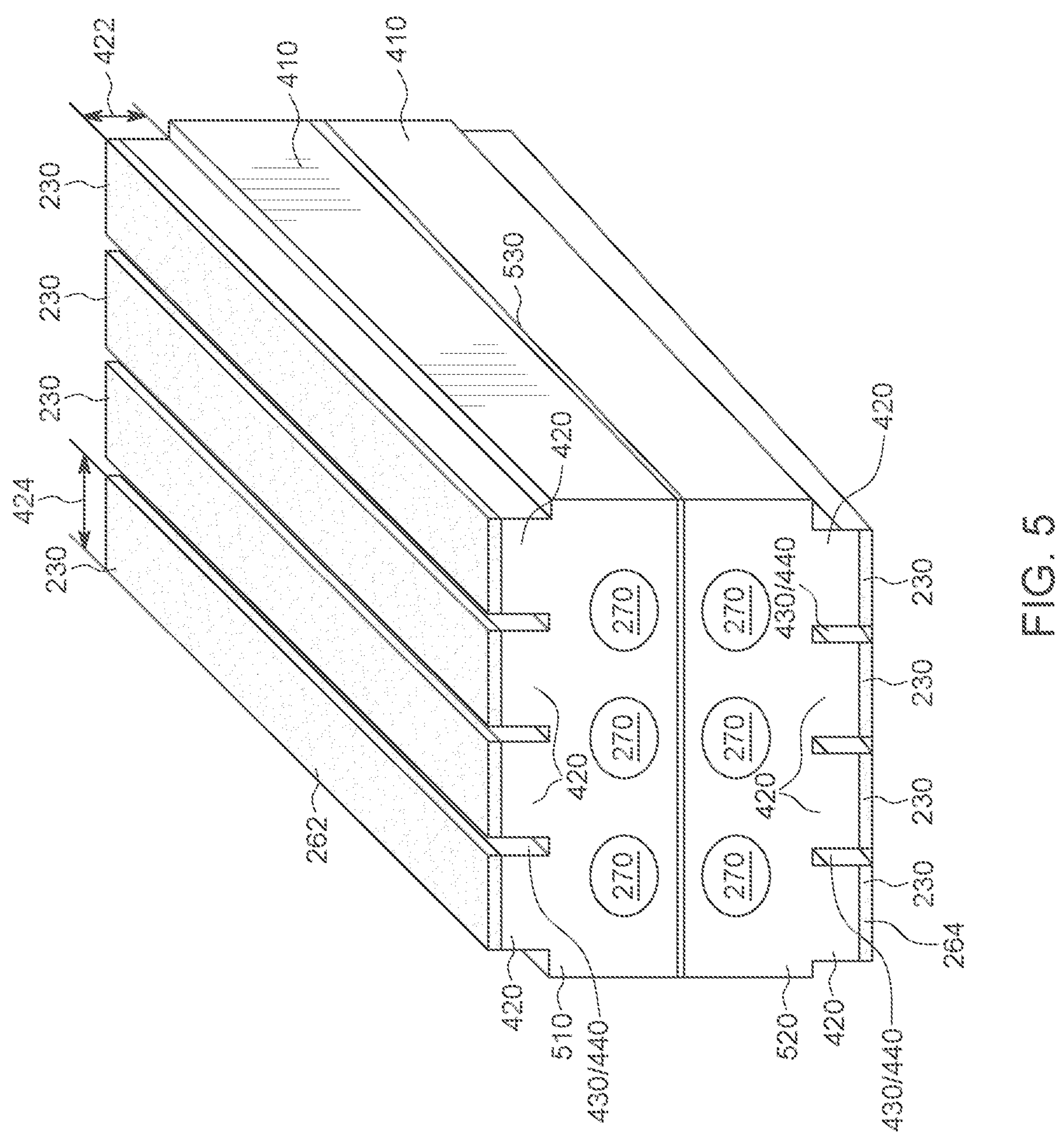
FIG. 5 shows an exemplary two-sided, two-piece coupled susceptor with raised sections.

In another embodiment as given in FIG. 5, instead of a two-sided single piece susceptor, a two-sided, two-piece substrate susceptor comprised of two susceptor halves, i.e., an upper first susceptor 510 and a lower second susceptor 520 coupled at a midpoint interface 530 may be utilized. The two susceptor halves may be joined by any suitable mechanical connection such as a clip lock connection for example. In a preferred embodiment of a two-piece susceptor, each susceptor half (510/520) utilizes its own heater elements 270 and the interface 530 may further comprise a heat resistant insulating layer, such as a fiberglass or ceramic fabric or plate to minimize cross conduction between the two susceptor halves. The two-piece susceptor structure has the added advantage of allowing for individualized temperature control of the upper and lower halves which will be discussed in greater detail later.

Figure 6A:
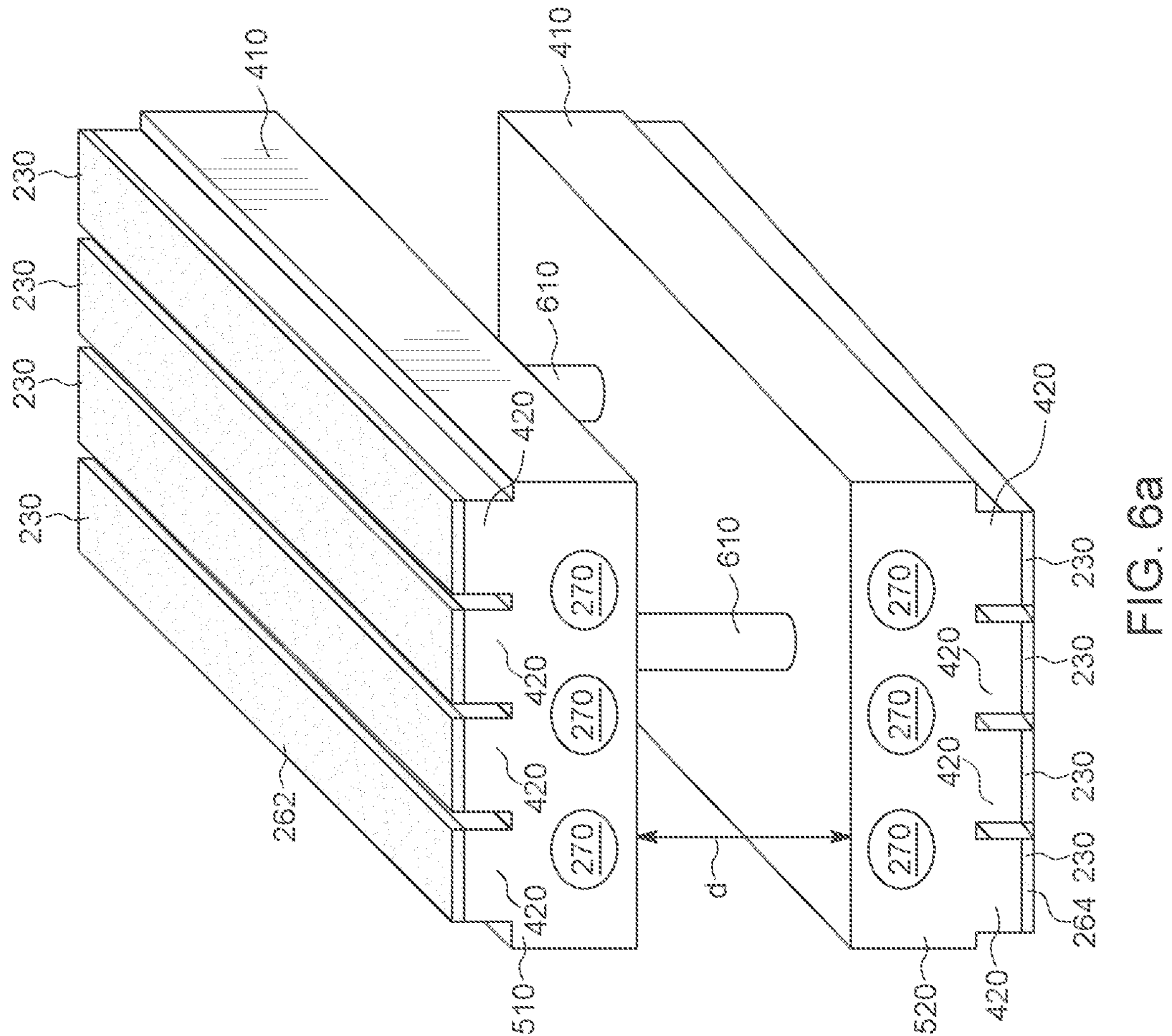
FIG. 6*a* shows an exemplary two-sided, two-piece susceptor with raised sections where each half is separated by a distance.

In yet another embodiment, the two halves of a two-piece susceptor (510/520) of FIG. 5, may be separated as shown in FIG. 6*a*. In this embodiment, susceptor halves 510 and 520 are spaced vertically apart by a distance d. In this example, the two halves are maintained distance d apart by two detachable connector posts 610, however it can be appreciated that the separation may be maintained by any of several methods including plates, spacers or other mechanical structures. In this two-piece separated susceptor embodiment, individual susceptor temperature control is further improved as well as enabling the ability to tune the vertical spacing to aid in substrate tape reel-to-reel handling characteristics, e.g., lessened tape bend radius, etc.

Figure 6B:
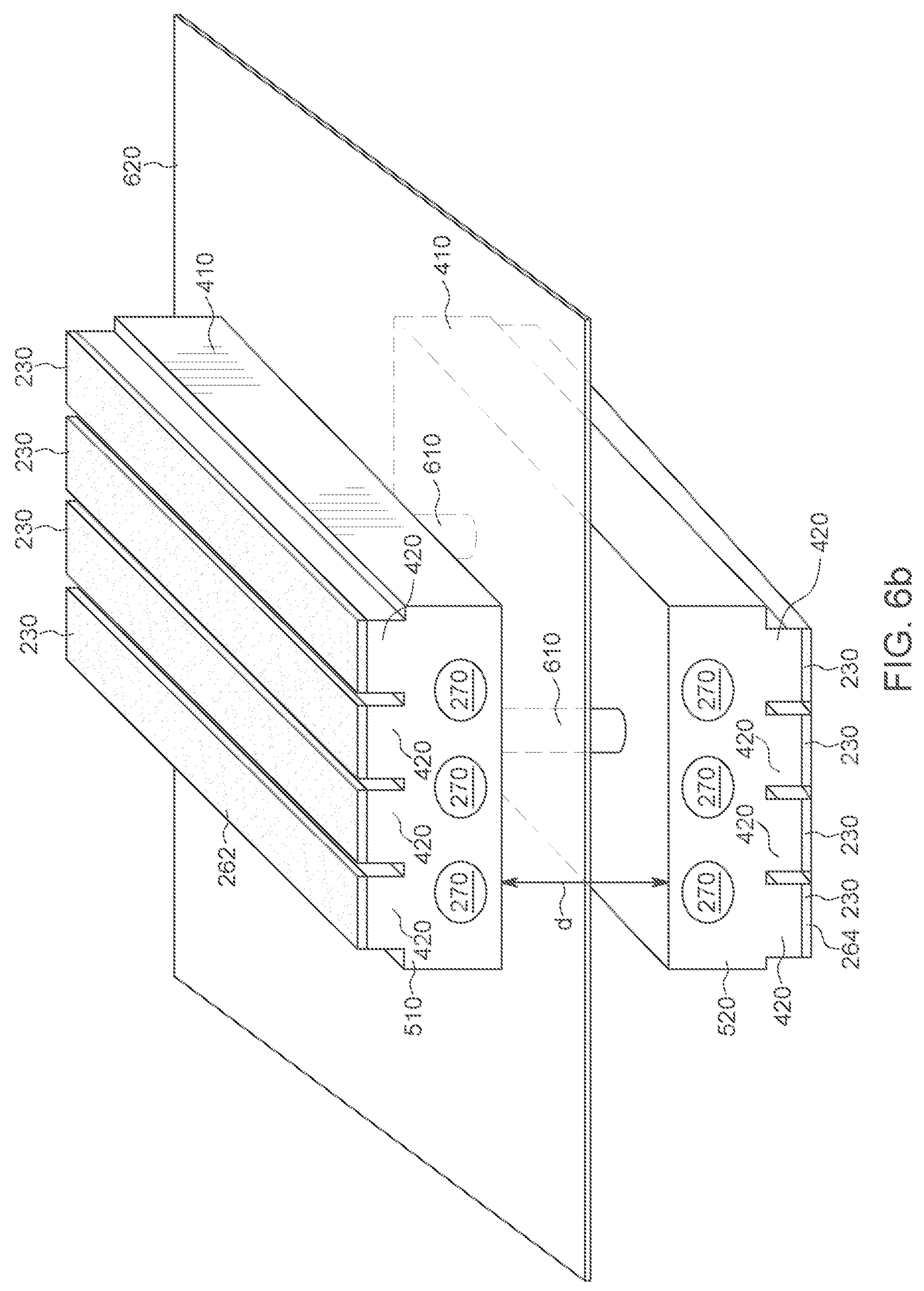
FIG. 6*b* shows an exemplary two-sided, two-piece susceptor with raised sections where each half is separated by a distance and with a divider plate.

FIG. 6*b* gives an example of two halves of a two-piece susceptor 510/520 with a divider plate or spacer 620 in between the two halves. This divider is located in between two susceptor halves and thus also aids in directing precursor 212 flows from upper and lower showerheads 210 (see e.g., FIG. 2) independently to the sides where separate outlet ports 220 may be located. This arrangement assists in achieving symmetrical YBCO deposition on both upper 510 and lower 520 susceptors to further increase throughput. Also note that such a divider plate 620 may be included with a two-piece susceptor of FIG. 5, i.e., where the two halves 510/520 are in direct contact without separation (d). In such an embodiment, divider plate 620 is thus sandwiched between 510 and 520 and may additionally act as a spacer of a given thickness and/or an insulator as previously discussed.

Figure 7:
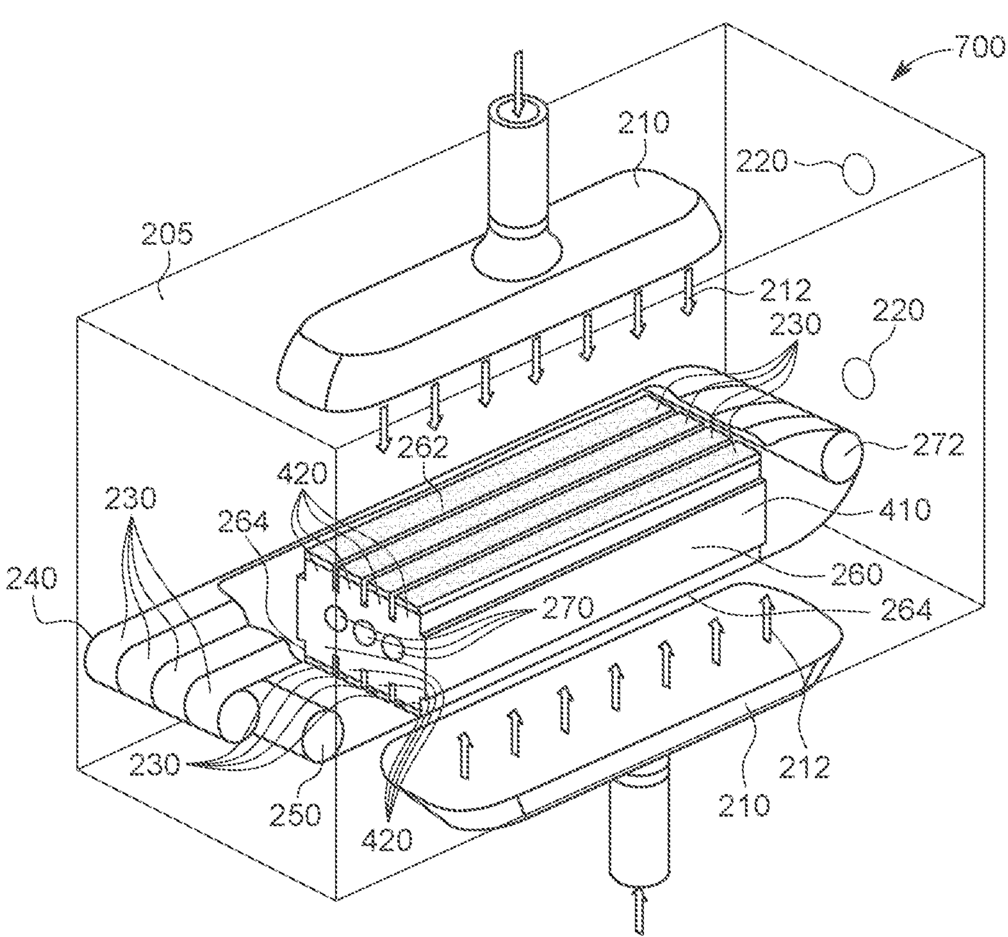
FIG. 7 shows an exemplary reactor apparatus with a two-sided, single piece susceptor.

An exemplary deposition reactor apparatus 700 employing a multi-lane configuration of the two-sided, one-piece substrate susceptor 262 of FIG. 4 is depicted in a 3D representation as FIG. 7. In this embodiment, deposition chamber 205 is maintained under vacuum via outlet ports 220. Chamber 205 houses precursor inlet showerheads 210 for introduction of precursors 212. In this example, four elongated substrate tapes 230 are supplied from payout reel 240, translate over and contacts raised sections 420 of upper surface 262 of substrate 260, reverse direction at internal roller 272 and contact lower surface 264 of substrate 260 before being taken up by reel 250.

Figure 8:
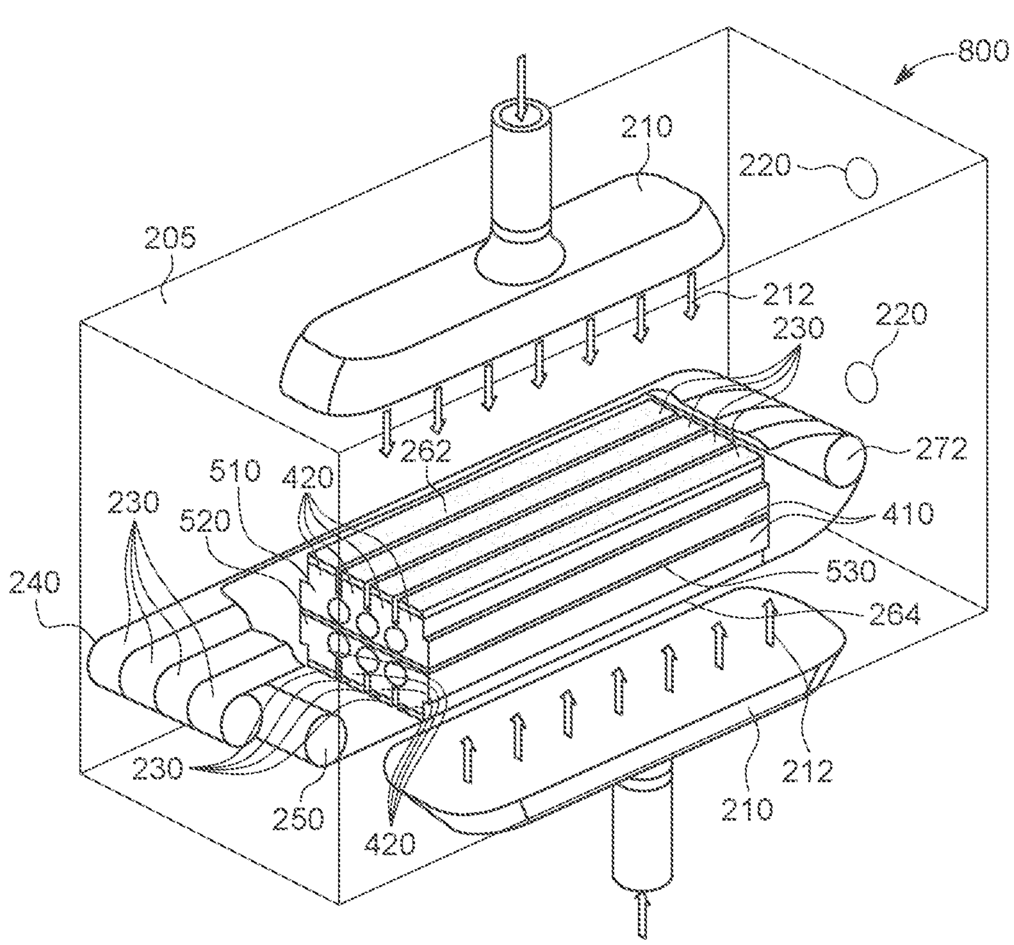
FIG. 8 shows an exemplary reactor apparatus with a two-sided, two-piece coupled susceptor.

Another exemplary deposition reactor 800 employing a multi-lane configuration but of the two-piece coupled substrate susceptor 510/520 of FIG. 5 is similarly depicted in a 3D representation as FIG. 8. In this embodiment, common elements of deposition chamber 205, outlet ports 220, and precursor inlet showerheads 210 are as described above. In this example, the substrate is comprised of two halves (upper 510 and lower 520) coupled at midpoint interface 530. This two-piece design allows for the two halves (510/520) to be individually thermally controlled with separate one or more heater elements 270. As with the previous embodiment, an exemplary four elongated substrate tapes 230 are supplied from payout reel 240, translate over and contacts the raised sections 420 of upper surface 262 of substrate 510, reverse direction at internal roller 272 and contacts lower surface 264 of substrate 520 before being taken up by reel 250. Also note that a divider plate 620 between susceptor halves 510/520 may be included as described above and as given in FIG. 6*b*.

Figure 9:
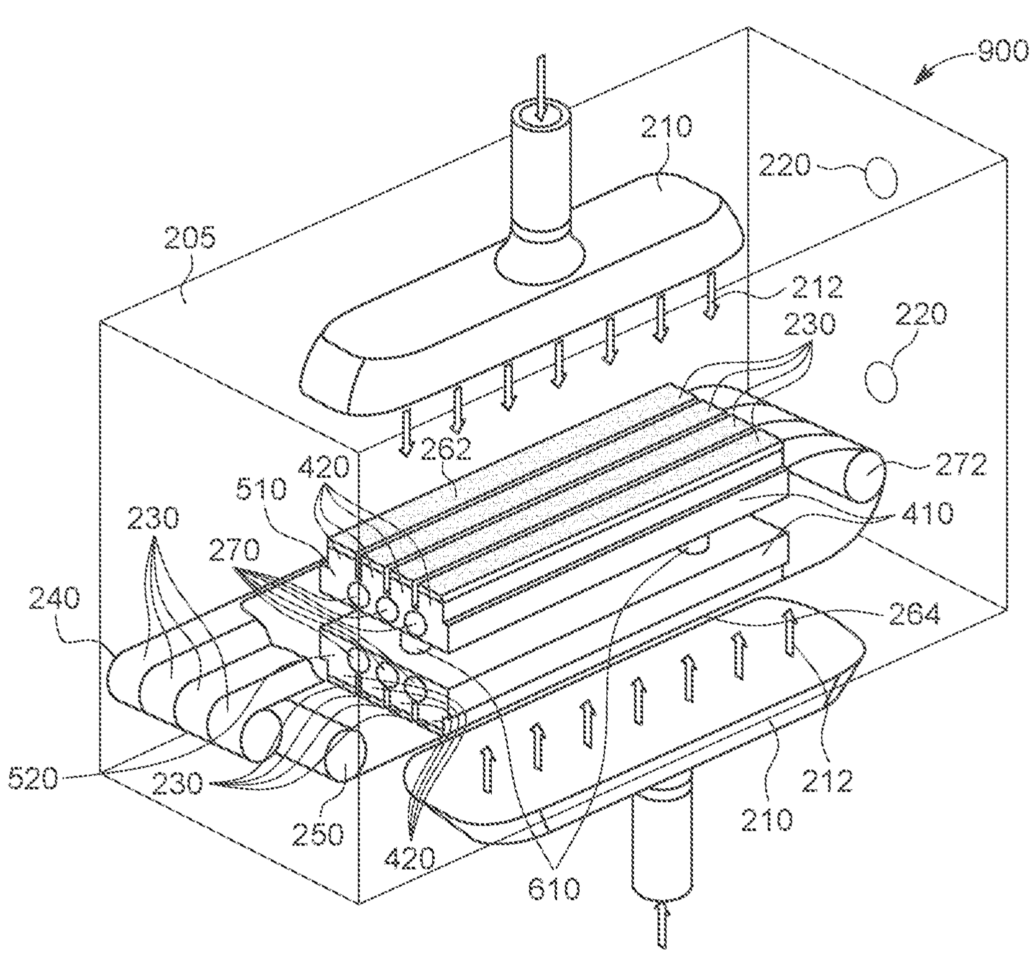
FIG. 9 shows an exemplary reactor apparatus with a two-sided, two-piece susceptor where each half is separated by a distance.

Yet another exemplary deposition reactor 900 employing a multi-lane configuration but of the two-piece substrate susceptor 510/520 of FIG. 6*a* is similarly depicted in a 3D representation as FIG. 9. In this embodiment, common elements of deposition chamber 205, outlet port 220, and precursor inlet showerhead 210 are again as described above. In this example, the substrate is comprised of two halves (upper 510 and lower 520) which are separated a distance d by two connector or spacer posts 610. This two-piece design also allows for the two halves (510/520) to be individually thermally controlled with separate one or more heater elements 270. As with the previous embodiment, an exemplary four elongated substrate tapes 230 are supplied from external payout reel 240, translate over and make contact with raised sections 420 of upper surface 262 of substrate 510, reverse direction at internal roller 272 and contacts lower surface 264 of substrate 520 before being taken up by reel 250. In this two-piece separated susceptor embodiment, individual susceptor temperature control is further improved as well as enabling the ability to tune the vertical spacing of substrate tapes 230 by adjustment of connector pins 610 which also aids improved tape handling. Also note that a divider plate 620 between susceptor halves 510/520 may be included as described above and as given in FIG. 6*b*.

Figure 10A:
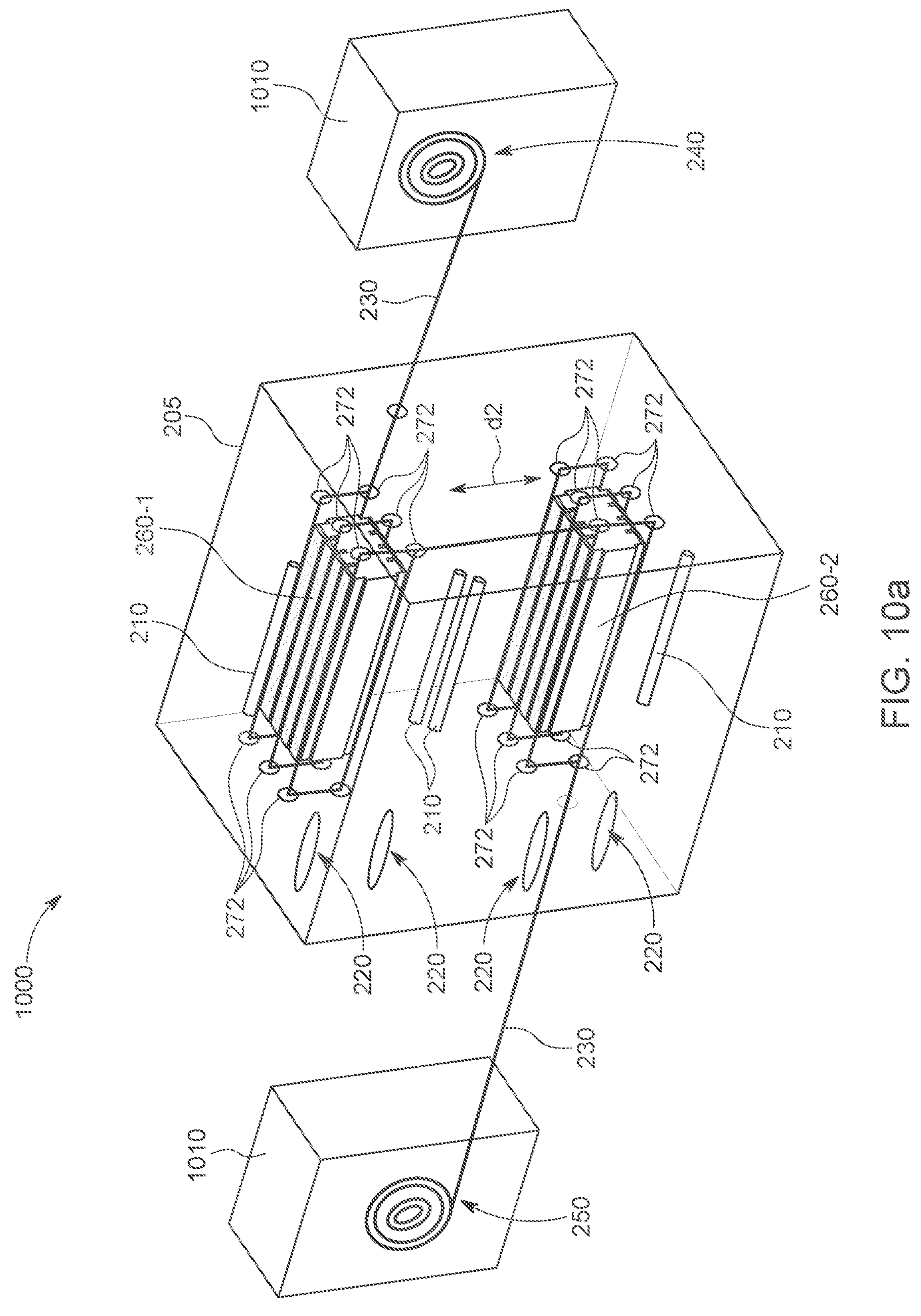
FIG. 10*a* shows an exemplary multi-stack reactor apparatus in 3D with more than one two-sided susceptors vertically arranged.

Additional throughput gains can be achieved by stacking multiple susceptors as disclosed herein in a single reactor apparatus 1000 as shown in exemplary FIG. 10*a*. In this embodiment, two two-sided, one-piece susceptors 260-1 and 260-2 are shown. However, it should be noted that the susceptor(s) shown as simple blocks and designated as 260-1 and 260-2 in the figure is for purposes of simplicity of presentation, but the susceptor(s) could comprise any number of or a combination of: a) a two-sided single piece substrate susceptor (260) as shown in FIGS. 2, 4, 7, and 10*a*); or b) two coupled single-sided substrate susceptors (510/520) as shown in FIGS. 5 and 8; or c) two separated single-sided substrate susceptors (510/520) as shown in FIGS. 6*a*/*b* and 9. Also for simplicity of view in FIG. 10*a*, only a single substrate tape 230 is shown wound helically around two vertically arranged susceptors 260 though other tape numbers and configurations as disclosed earlier are possible.

In the exemplary multi-stack susceptor reactor apparatus 1000 of FIG. 10*a*, two susceptors 260 are vertically spaced apart a distance d2 within deposition chamber 205. Multiple precursor inlet showerheads 210 direct precursors 212 to the surface of substrate tape 230 as the tape passes above and under each susceptor. Note that these showerheads 210 may be fed by a single manifold flow distributor (not shown) located within or outside chamber 205. Also, in this example, outlet ports 220 are located on a sidewall of chamber 205 but may be located on the bottom or combination of wall locations of chamber 205. In this example, a single substrate tape 230 is fed from external payout reel 240 housed within enclosure 1010 which may be maintained under seal and/or vacuum or positive pressure to minimize substrate and reactor contamination. Also note that substrate tape(s) 230 may be further enclosed within conduits (not shown) extending between enclosures 1010 and reactor chamber 205 to maintain pressure and cleanliness. (As discussed earlier, payout and/or take-up reels may alternatively be located within chamber 205.)

Substrate tape 230 winds around one susceptor 260-1 via one or more rollers 272 any number of times before being "passed" to the second susceptor 260-2. Rollers 272 may be configured at each corner of a susceptor 260 as shown or at a distal midpoint of the susceptor as given in the example of FIG. 2 or other arrangement to reduce the number of rollers needed and thus reduce translation resistance and friction.

In this example, a single substrate tape 230 passes three times above and below each susceptor/susceptor pair, but any number of tapes and passes (or windings) per susceptor may be utilized as determined by a number of design factors including, for example: the dimensions of the substrate tape, the translation speed or feed rate of the substrate tape, the susceptor dimensions, the reactor size and volume, the showerhead design, the target growth rate and the overall throughput rate desired etc. As the number of susceptors increases, the tape speed will increase accordingly to keep the overall residence time of the tape inside the reactor equal between different reactors with different numbers of susceptors. This tape speed increase will then increase the tape production throughput by a multiple factor as determined by the number of susceptors. Further, to be discussed in greater detail below, the number of passes per each susceptor need not be equivalent which may allow for the tailoring or individualizing of conditions at each susceptor to achieve varying growth rate at each susceptor.

Figure 10B:
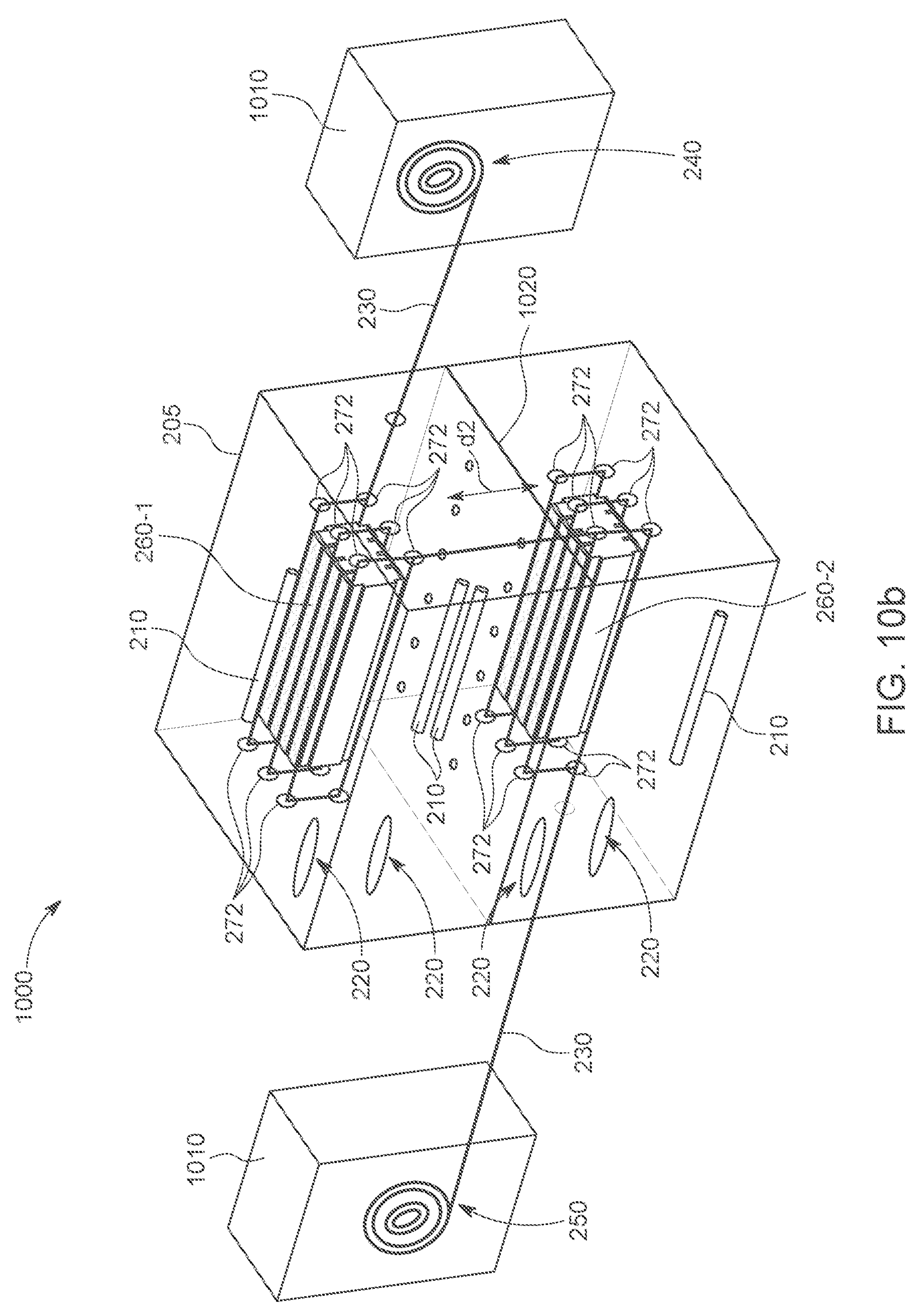
FIG. 10*b* shows an exemplary multi-stack reactor apparatus in 3D with an internal divider plate.

In another modification of the multi-stack reactor of FIG. 10*a*, as illustrated in FIG. 10*b*, a partial internal divider plate 1020 may be included inside reactor chamber 205 in any of the multi-stack susceptor reactor apparatus disclosed herein. In the example shown in FIG. 10*b* a perforated plate 1020 is located in-between susceptors 260-1 and 260-2 to aid in maintaining flow uniformity at each susceptor pair. The degree of perforation may be tailored, i.e., more highly perforated with larger and/or more numerous holes, to allow each susceptor to operate at a different pressure owing to each half having its own showerhead(s) 210 and outlet(s) 220. In other embodiments, plate 1020 may also comprise a wall extending only partially from opposite walls of chamber 205 and in between susceptors or susceptor pairs (see e.g., FIG. 11*c* below).

Figure 11A:
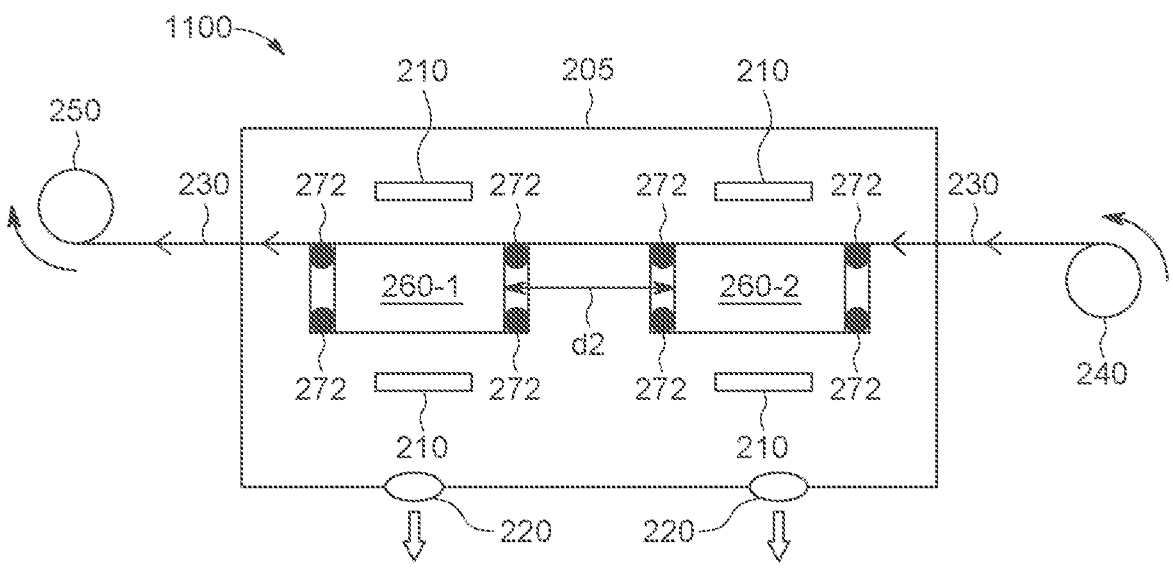
FIG. 11*a* shows an exemplary multi-stack reactor apparatus with more than one two-side susceptors horizontally arranged.
Figure 11B:
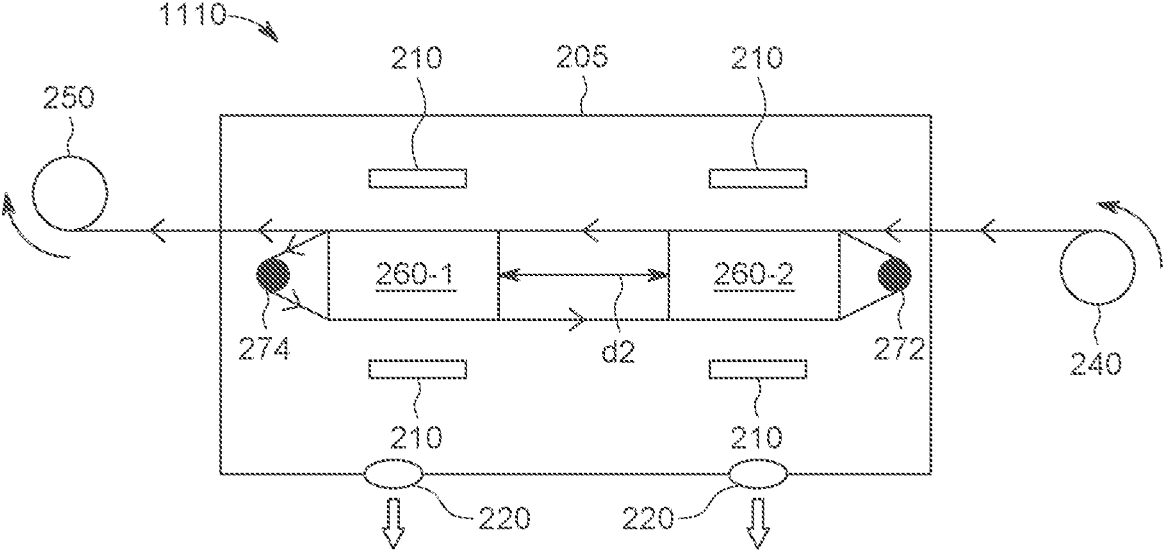
FIG. 11*b* shows an additional embodiment of a tape configuration in a multi-stack reactor apparatus with more than one two-side susceptors horizontally arranged.
Figure 11C:
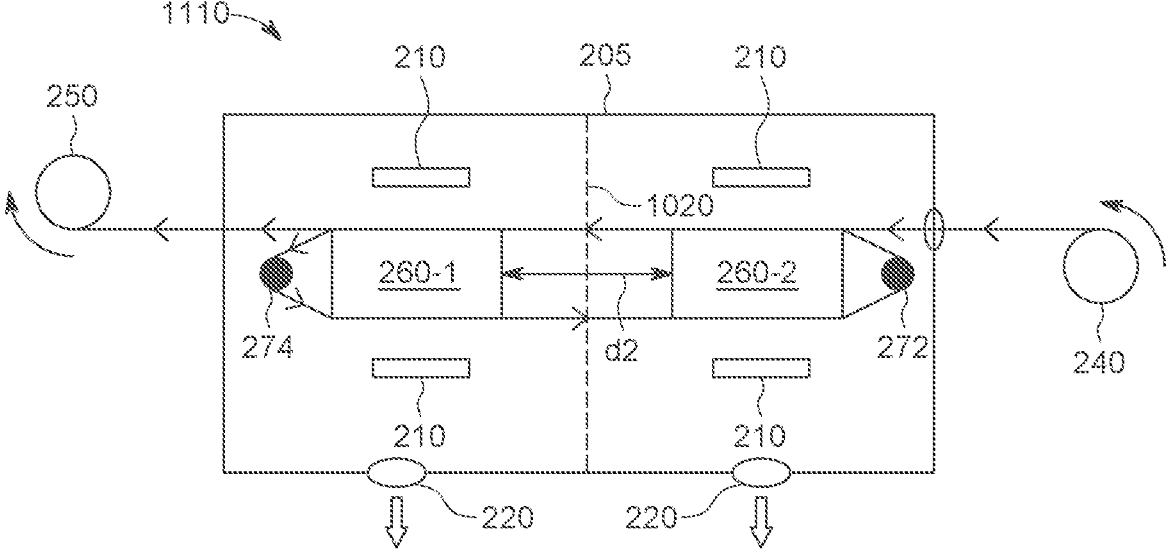
FIG. 11*c* shows an additional embodiment of a tape configuration in a multi-stack reactor apparatus with more than one two-side susceptors horizontally arranged and with an internal divider plate.

Other embodiments of a multi-stack susceptor reactor apparatus 1100 and 1110 are shown in 2D sideview FIGS. 11*a* and 11*b*. In FIG. 11*a*, susceptors 260-1 and 260-2 are horizontally separated by a distance d2 as compared to vertically separated as shown in FIG. 10*a*. This configuration has the added benefit of reducing the number of rollers 272 as shown in FIG. 11*b* thus simplifying the tape handling and generally simplifying outlet porting 220. Whether the multi-stack susceptors are separated vertically (1100) or horizontally (1110), the two-sided susceptors disclosed herein allow for a high degree of scalability of the reactor apparatus to achieve a desired throughput. Reactor apparatus 1000/1100/1110 may include banks or sets of 2, 3, 4 or more susceptors and depending upon the number of substrate tapes and passes (windings), significant production rate enhancement can be achieved as compared to single tape or multiple tapes with single sided susceptors. As discussed above in reference to FIG. 10*b*, FIG. 11*c* depicts the multi-stack reactor of FIG. 11*b* with an internal perforated divider plate 1020 within chamber 205. Plate 1020 is located in between the two susceptors 260-1 and 260-2 to aid in independently controlling flow and pressure at each susceptor (260-1/260-2) or susceptor pair (510/520). Note that divider plate 1020 of course may be horizontally oriented in the event of vertically arranged stacks of susceptors.

It is a further advantage of the susceptors and reactors disclosed herein to permit a high degree of customization of deposition conditions at each susceptor thus allowing for the staging or sequential tailoring of growth rate parameters as a tape progresses through the reactor. The heaters for different susceptors can be set to different temperatures and similarly gas flows can be set to different flows for optimizing high quality initial epitaxial layer and faster (or slower) YBCO bulk film growth.

Figure 12:
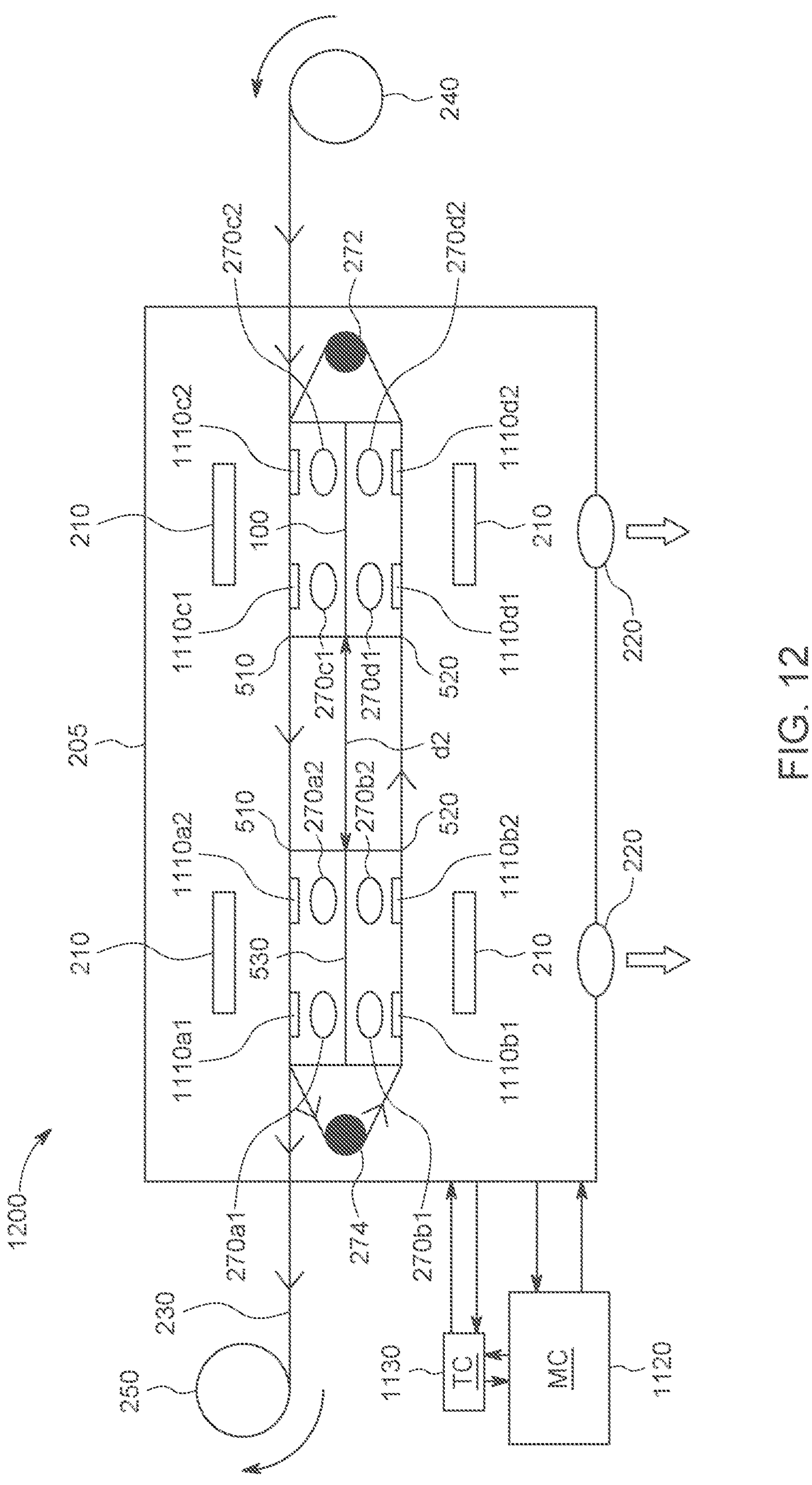
FIG. 12 shows an exemplary reactor system employing multiple two-side susceptors.

An example of a variable conditions multi-stack reactor is given in FIG. 12. The exemplary reactor apparatus and system 1200 shown is comprised of a laterally arranged stack of two two-piece coupled substrate susceptors 510/520 coupled at midline 530 (see e.g., FIG. 5) and housed within deposition chamber 205. Each susceptor half has a separate precursor inlet showerhead 210 and in this example, chamber 205 is evacuated by a two symmetrically arranged outlet ports 220. Also in this example, each susceptor pair (510/520) is heated by two individual heater elements and each susceptor's temperature is monitored by two thermocouples. For example, the upper left susceptor 510 is heated by heaters 270*a*1 and 270*a*2 and is monitored by thermocouples 1110*a*1 and 1110*a*2. The bottom half 520 of the susceptor pair is similarly heated by 270*b*1 and 270*b*2 and monitored by thermocouples 1110*b*1 and 1110*b*2. The other susceptor pair is similarly configured.

Reactor system 1200 thus comprises a deposition chamber 205 housing the components described above (inlet showerheads 210, outputs 220, substrate tape 230, and susceptors 510/520 etc.), as well as master controller 1120 having an input/output interface configured to receive data (P) from a measuring unit such as thermocouples 1110 (*a*1 . . . *d*2) or other temperature sensing devices (e.g., passive Infra-Red etc.). Controller 1120 may also send and receive data and inputs from other devices and measuring units, such as flow meters, pressure gauges or transducers, tape speed meters, end coders and other units, devices and sensors to measure other parameters associated with the reactor apparatus. Controller 1120 includes a data processor configured to compute a target susceptor 510/520 and/or substrate tape 230 temperature based on real time temperature readings from the thermocouples and adjust other parameters (P1, P2, . . . $P_i$) such flowrates, tape speeds, and heater inputs accordingly.

Thus controller 1120 sends thermal input settings to second controller (SC) which in this example is a temperature controller 1130 which individually controls heat inputs to heater elements 270 (*a*1 . . . *d*2) based on measured data (P) thus adjusting the thermal regulation of individual susceptors and susceptor surfaces. In this manner, for example utilizing the two-stack, two-piece coupled substrate susceptors 510/520 of FIG. 12, controller 1120 may control deposition conditions at four zones within the stack or even achieve a predetermined temperature profile within a single zone, e.g., a single susceptor surface (upper 262 or lower 264). For example, a five-degree ramp may be inputted from 1110*a*2 to 1110*a*1. With this capability, the growth rates, and thicknesses of buffer and HTS layers may be staged to achieve highly specific growth profiles within a single reactor.

An exemplary method 1300 for high-throughput production of high-temperature superconductors will now be discussed with reference to FIG. 13. The method includes the step 1310 of providing a deposition chamber 205 which includes a precursor showerhead 210, a step 1312 of maintaining said chamber under vacuum conditions via evacuation via at least one outlet port 220, a step 1314 of providing a two-sided one-piece susceptor 260 or a pair of opposing one-sided susceptors 510/520 that are coupled together or separated by a vertical distance, a step 1316 of heating upper 262 and lower 264 surfaces of said susceptor(s) (260/510/520) with a prescribed number of heater elements 270, a step 1318 of translating at least one elongated substrate tape 230 through a deposition zone within chamber 205 wherein translation of the substrate tape 230 includes contacting an upper 262 and lower 264 surface of each susceptor 260 or opposing surfaces of a susceptor pair (510/520), a step 1320 of introducing precursor materials 212 into the deposition chamber 205 via the precursor showerhead 210, and a step 1322 of depositing a thin film, e.g., YBCO.

Figure 14:
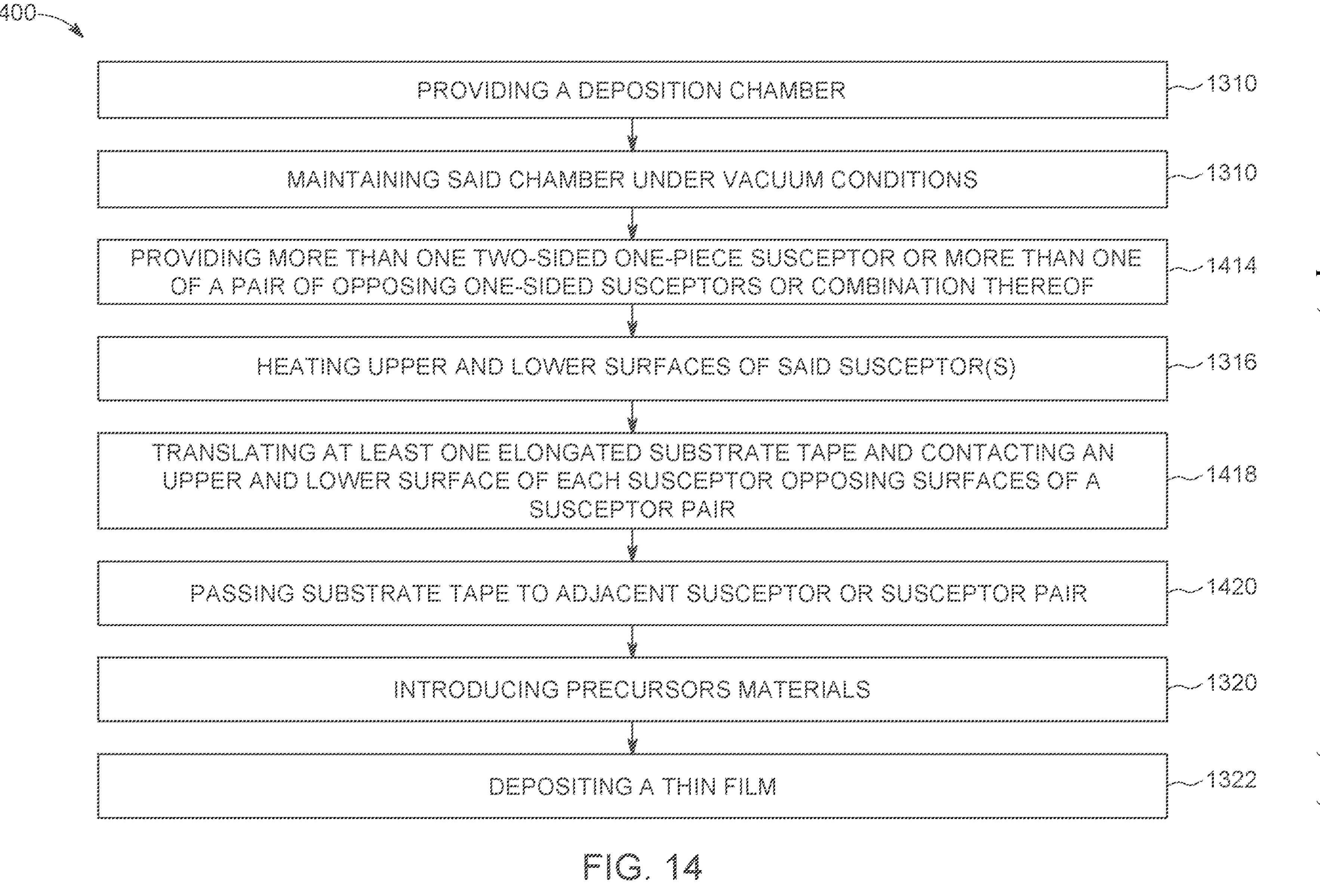
FIG. 14 shows another exemplary method producing thin film materials.

In another application as illustrated in FIG. 14, a method 1400 may include method 1300 steps above and further include a step 1414 of providing a multi-stack configuration of susceptors to include more than one two-sided 260 or more than one one-sided opposing pairs (510/520) or a combination thereof as described herein within a single deposition chamber 205. In this application, the step of translating 1418 the at least one elongated substrate tape 230 includes the additional step 1420 of passing the tape(s) 230 to a second or subsequent susceptor or susceptor pair which may be arranged laterally or vertically with respect to one another, or in certain additional embodiments, susceptors of three or more may be arranged in both vertical and horizontal positions with respect to one another.

Figure 15:
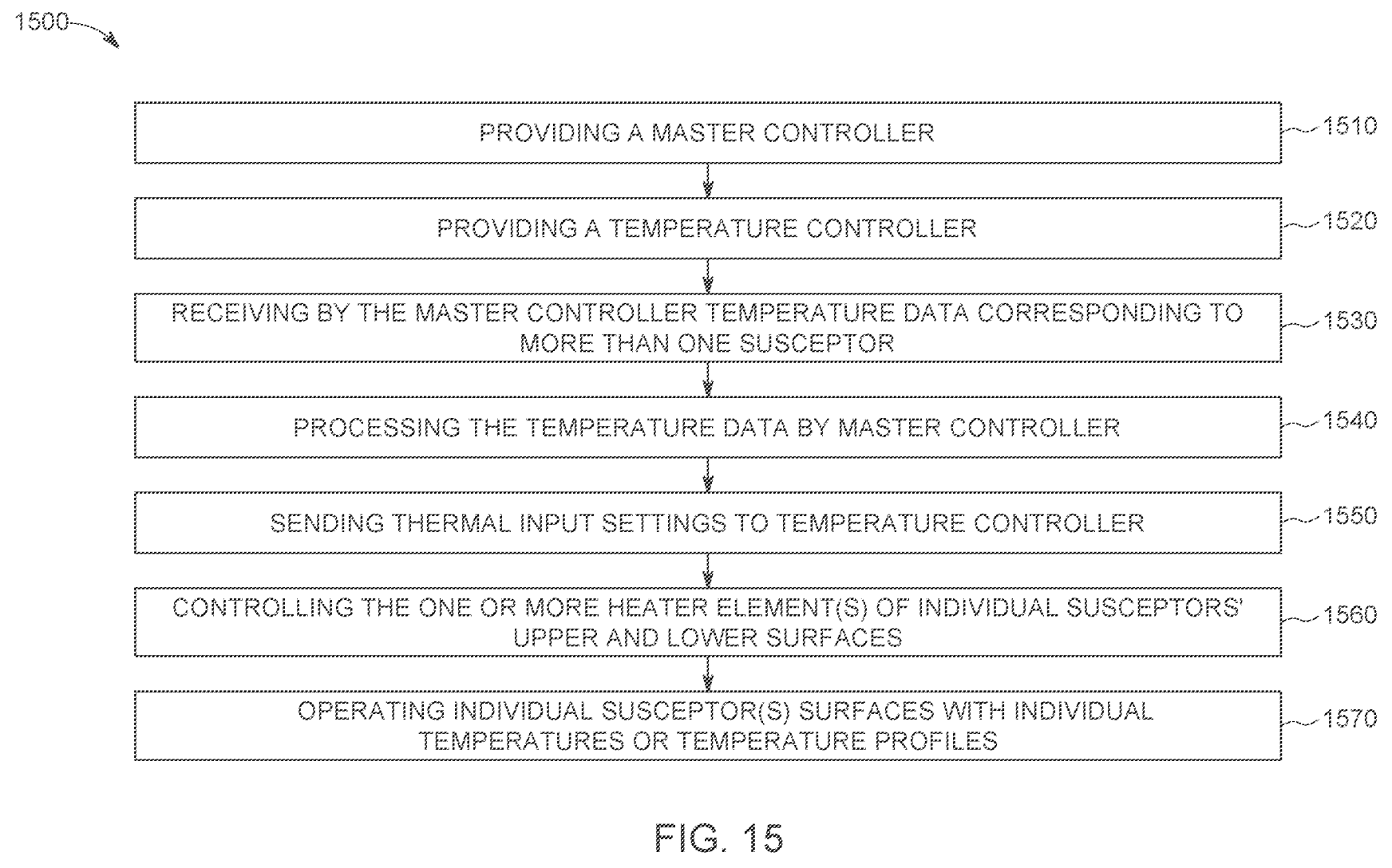

The methods described above may further include additional steps of achieving variable deposition conditions as illustrated in FIG. 15. In these applications, the method 1500 includes the steps of methods 1300 and 1400 and additionally include a step 1510 of providing a master controller 1120, a step 1520 of providing a temperature controller 1130, a step 1530 of receiving by the master controller 1120 temperature data corresponding to more than one susceptor (260/510/520), a step 1540 of processing the temperature data by master controller 1120, a step 1550 of sending thermal input settings to temperature controller 1130 by master controller 1120, a step 1560 of controlling the one or more heater element(s) 270 of individual susceptors (260/510/520) upper 262 and lower 264 surfaces within reactor chamber 205, and the step 1570 of operating individual susceptors surfaces with individual temperatures or temperature profiles.

The description provided herein discloses examples of the subject matter pertinent to high throughput production of deposited products, in particular High-Temperature Superconductors (HTS). The examples provided herein are intended to enable those skilled in the art to practice the same, including making and using any apparatus, system and performing the methods described in any combination. The patentable scope of the subject matter is thus defined by the claims and may include other examples that fall within the scope of the claims that occur to those skilled in the art having the benefit of the present disclosure.

What is claimed is:

1. A method for producing a superconductor on an elongated substrate tape, the method comprising:
- providing a deposition chamber housing a precursor inlet showerhead, an outlet port, and a heated substrate susceptor having more than one tape contacting surface comprising upper and lower surfaces of the susceptor;
- maintaining said deposition chamber under vacuum conditions via evacuation by the outlet port;
- heating each tape contacting surface of said susceptor with at least one heater element;
- translating the elongated substrate tape through a deposition zone within the chamber, wherein the substrate tape slidably contacts each of the more than one tape contacting surfaces of the susceptor;
- introducing precursor materials into the deposition chamber via the precursor showerhead; and
- depositing at least one layer of a thin film upon the elongated substrate tape.

2. The method of claim 1, wherein the more than one tape contacting surfaces of the susceptor further comprise more than one raised section each with a width substantially the width of the elongated substrate tape and each raised section extends vertically from the upper surface of a main body of the susceptor and lengthwise along the length of the main body of the susceptor such that two adjacent raised sections form a channel.

3. The method of claim 1, wherein the elongated substrate tape winds around the susceptor more than once.

4. The method of claim 1, wherein the elongated substrate tape is comprised of more than one parallel tape translating together.

5. The method of claim 1, wherein the least one layer of the deposited thin film is a superconducting YBCO layer.

6. A method for producing a superconductor on an elongated substrate tape, the method comprising:
- providing a deposition chamber housing a precursor inlet showerhead, an outlet port, and a pair of opposing one-sided susceptors;
- maintaining said deposition chamber under vacuum conditions via evacuation by the outlet port;
- heating tape contacting surfaces of each susceptor with a heater element;
- translating the elongated substrate tape through a deposition zone within the chamber, wherein the substrate tape slidably contacts the upper surface of one of the pair of opposing one-sided susceptors and the lower surface of the second of the pair of opposing one-sided susceptors;
- introducing precursor materials into the deposition chamber via the precursor showerhead; and
- depositing at least one layer of a thin film upon the elongated substrate tape.

7. The method of claim 6, wherein the pair of opposing susceptors are coupled together.

8. The method of claim 6, wherein the pair of opposing susceptors further comprises a dividing plate located between the pair of opposing susceptors.

9. The method of claim 6, wherein the pair of opposing susceptors are separated by a vertical distance (d).

10. The method of claim 6, wherein each opposing susceptor further comprises more than one raised section each with a width substantially the width of the elongated substrate tape and each raised section extends vertically from the upper surface of a main body of the susceptor and lengthwise along the length of the main body of the susceptor such that two adjacent raised sections form a channel.

11. The method of claim 6, wherein the elongated substrate tape winds around the pair of opposing susceptors more than once.

12. The method of claim 6, wherein the elongated substrate tape is comprised of more than one parallel tape translating together.

13. The method of claim 12, wherein each elongated substrate tape winds around the pair of opposing susceptors more than once.

14. The method of claim 6, wherein the deposited thin film is a superconducting YBCO layer.

* * * * *